(12) United States Patent
Mohammad et al.

(10) Patent No.: US 12,292,753 B2
(45) Date of Patent: May 6, 2025

(54) LOW POWER DIGITAL LOW-DROPOUT POWER REGULATOR

(71) Applicant: Khalifa University of Science and Technology, Abu Dhabi (AE)

(72) Inventors: Baker Mohammad, Round Rock, TX (US); Dima Kilani, Abu Dhabi (AE); Hani Saleh, Round Rock, TX (US)

(73) Assignee: Khalifa University of Science and Technology, Abu Dhabi (AE)

( * ) Notice: Subject to any disclaimer, the term of this patent is extended or adjusted under 35 U.S.C. 154(b) by 397 days.

(21) Appl. No.: 17/782,562

(22) PCT Filed: Dec. 4, 2020

(86) PCT No.: PCT/US2020/063192
§ 371 (c)(1),
(2) Date: Jun. 3, 2022

(87) PCT Pub. No.: WO2021/113563
PCT Pub. Date: Jun. 10, 2021

(65) Prior Publication Data
US 2023/0012155 A1   Jan. 12, 2023

Related U.S. Application Data

(60) Provisional application No. 62/944,307, filed on Dec. 5, 2019.

(51) Int. Cl.
*G05F 1/59* (2006.01)
*G05F 1/46* (2006.01)
(Continued)

(52) U.S. Cl.
CPC .............. *G05F 1/59* (2013.01); *G05F 1/462* (2013.01); *G05F 1/468* (2013.01); *G05F 1/575* (2013.01); *H03K 19/094* (2013.01)

(58) Field of Classification Search
CPC . G05F 1/59; G05F 1/462; G05F 1/468; G05F 1/575; H03K 19/094
See application file for complete search history.

(56) References Cited

U.S. PATENT DOCUMENTS 6,339,347 B1 *  1/2002  Dai ................... H03K 19/09485
                                                       326/119
11,099,591 B1 *  8/2021  Köse ........................ G05F 1/59
(Continued)

OTHER PUBLICATIONS

PCT/US2020/063192, International Search Report and Written Opinion, Mailed On Mar. 31, 2021, 14 pages.

*Primary Examiner* — Alex Torres-Rivera
*Assistant Examiner* — Lakaisha Jackson
(74) *Attorney, Agent, or Firm* — Kilpatrick Townsend & Stockton LLP

(57) ABSTRACT

Digital logic voltage regulators and related methods generate a regulated voltage via controlled switching of a power transistor. A digital logic voltage regulator includes a voltage level comparator, a power transistor, and a charge accumulator. The voltage level comparator generates a digital control signal that alternates between a first voltage level and a second voltage level in response to changes in relative voltage level between the regulated output voltage and the target voltage. The digital control signal causes the power transistor to switch from off to on in response to a reduction of the regulated output voltage relative to the target voltage and causes the power transistor to switch from on to off in response to an increase of the regulated output voltage relative to the target voltage. The charge accumulator decreases variation in the regulated output voltage that would occur without the charge accumulator.

15 Claims, 4 Drawing Sheets

(51) Int. Cl.
   *G05F 1/575*   (2006.01)
   *H03K 19/094*   (2006.01)

(56) References Cited

U.S. PATENT DOCUMENTS

| | | |
|---|---|---|
| 2010/0156364 A1 | 6/2010 | Cho et al. |
| 2012/0176107 A1 | 7/2012 | Shrivas et al. |
| 2014/0277812 A1* | 9/2014 | Shih .......................... G05F 1/46 700/297 |
| 2015/0035505 A1 | 2/2015 | Peluso |
| 2018/0019667 A1 | 1/2018 | Salem et al. |
| 2018/0329440 A1* | 11/2018 | Jefremow ............... G05F 1/575 |
| 2022/0103177 A1* | 3/2022 | Shi ................... H03K 19/17736 |

* cited by examiner

LOW POWER DIGITAL LOW-DROPOUT POWER REGULATOR

BACKGROUND

On-chip voltage regulators are an important part of many electronic circuit designs, especially for mobile applications such as cell phones, cameras, Internet-of-Things (IoT), etc. An on-chip voltage regulator can be used to generate different voltage levels for different parts of a chip to enable each part of the chip to operate at its optimum performance and energy efficiency. For example, a graphics core part of a chip may require a higher voltage than a multi-media sub-system or application processor part of the chip. Power dissipation of a chip is a strong function of the voltage level, almost according to a quadratic relation ($P=CV^{2F}$). Hence, reducing voltage and frequency, where practicable, can reduce power consumption of the chip.

There are two types voltage regulators: low drop out (LDO) regulators and switched converters. An advantages of an LDO regulator is that it produces a clean regulated voltage ripple. An LDO regulator, however, has a low power efficiency at a high voltage conversion ratio. Conversely, a switched converter can achieve a high power efficiency but may produce a high voltage ripple. For some chips that include a radio frequency block and/or an analog block, which require a clean regulated voltage level, an LDO regulator is favored.

One conventional design of an LDO regulator includes a P-type metal-oxide-semiconductor logic (PMOS) transistor and an analog operational amplifier. In such an LDO regulator, however, an error amplifier of the LDO may not operate properly when the supplied voltage is below 0.6 V. In contrast, a digital LDO (DLDO) can be configured to supply a low voltage level. One conventional design of a DLDO includes a clocked comparator and synchronous shift register circuits. Such digital circuits, however, introduce more delay, which affects the transient response and consumes more power.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Embodiments described herein are directed to digital logic voltage regulators and related methods. In many embodiments, a digital logic voltage regulator employs a voltage comparator configured to control the voltage level of a digital bit used to control switching of a PMOS power switch with a small delay so as to limit drift of an output voltage from a target voltage, thereby limiting variations between the output voltage from the target voltage.

Thus, in one aspect, a low-dropout power regulator includes a first block and a second block. The first block includes a ratioed logic comparator. The second block includes a P-type metal-oxide-semiconductor logic (PMOS) power switch. The ratioed logic comparator is configured to receive a reference voltage and a line voltage and generate a digital bit comparison based on the reference voltage and the line voltage. The PMOS power switch is configured to activate or deactivate based on the generated digital bit comparison.

In another aspect, a digital logic voltage regulator for generating a regulated output voltage includes a voltage level comparator, a power transistor, and a charge accumulator. The voltage level comparator includes a first input and a second input. A target voltage is applied to the first input. The regulated output voltage is applied to the second input. The voltage level comparator generates a digital control signal that alternates between a first voltage level and a second voltage level in response to changes in relative voltage level between the regulated output voltage and the target voltage. The power transistor includes a power transistor gate terminal, a power transistor source terminal, and a power transistor drain terminal. The digital control signal is applied to the power transistor gate terminal. The power transistor source terminal is connected to a power source. The power transistor drain terminal is connected to an electrical load to supply electrical power having the regulated output voltage. The digital control signal causes the power transistor to switch from off to on in response to a reduction of the regulated output voltage relative to the target voltage. The digital control signal causes the power transistor to switch from on to off in response to an increase of the regulated output voltage relative to the target voltage. The charge accumulator is connected to the power transistor drain terminal so as to decrease variation in the regulated output voltage that would occur without the charge accumulator.

In many embodiments, the power transistor is switched based on a relative difference between the regulated output voltage and the target voltage. For example, in many embodiments, the digital control signal causes the power transistor to switch from off to on in response to a reduction of the regulated output voltage from greater than the target voltage to less than the target voltage and/or the digital control signal causes the power transistor to switch from on to off in response to an increase of the regulated output voltage from less than the target voltage to greater than the target voltage.

The charge accumulator can have any suitable configuration. For example, in many embodiments, the charge accumulator includes a capacitor connected between the power transistor drain terminal and a ground voltage.

The voltage level comparator can have any suitable configuration. For example, in many embodiments, the voltage level comparator includes a logic circuit comprising the first input, the second input, and a logic circuit output. The logic circuit can generate a logic circuit output voltage that is output via the logic circuit output. The logic circuit output voltage can vary between a logic circuit upper limit output voltage and a logic circuit lower limit output voltage based on a relative difference between the regulated output voltage and the target voltage. The logic circuit output voltage can be equal to a logic circuit intermediate output voltage when the regulated output voltage is equal to the target voltage. The logic circuit intermediate output voltage can be less than the logic circuit upper limit output voltage and greater than the logic circuit lower limit output voltage. The logic circuit output voltage can be greater than the logic circuit intermediate output voltage when the regulated output voltage is less than the target voltage. The logic circuit output voltage can be less than the logic circuit intermediate output voltage when the regulated output voltage is greater than the target voltage. The logic circuit upper limit output voltage can be less than the target voltage. The logic circuit output voltage can be less than the logic circuit intermediate output voltage when the regulated output voltage is greater than the target voltage.

The logic circuit can have any suitable configuration. For example, in many embodiments, the logic circuit includes a first transistor and a second transistor. The first transistor includes a first transistor gate terminal, a first transistor source terminal, and a first transistor drain terminal. The first transistor can be a PMOS transistor. A ground voltage can be applied to the first transistor gate terminal. The target voltage can be applied to the first transistor source terminal. The first transistor drain terminal can be connected to the logic circuit output. The second transistor includes a second transistor gate terminal, a second transistor source terminal, and a second transistor drain terminal. The second transistor can be a N-type metal-oxide-semiconductor logic (NMOS) transistor. The regulated output voltage can be applied to the second transistor gate terminal. The ground voltage can be applied to the second transistor drain terminal. The second transistor source terminal can be connected to the logic circuit output.

The voltage level comparator can include an inverter circuit that includes an inverter circuit input and an inverter circuit output. The logic circuit output voltage can be applied to the inverter circuit input. The inverter circuit can generate an inverter circuit output voltage that is output via the inverter circuit output. The inverter circuit output voltage can change from an inverter circuit first output voltage to an inverter circuit second output voltage in response to a decrease in magnitude of the logic circuit output voltage. The inverter circuit output voltage can change from the inverter circuit second output voltage to the inverter circuit first output voltage in response to an increase in magnitude of the logic circuit output voltage. The inverter circuit first output voltage has an inverter circuit first output voltage magnitude. The inverter circuit second output voltage has an inverter circuit second output voltage magnitude. The inverter circuit second output voltage magnitude can be greater than the inverter circuit first output voltage magnitude.

The inverter circuit can include a third transistor and a fourth transistor. The third transistor includes a third transistor gate terminal, a third transistor source terminal, and a third transistor drain terminal. The third transistor can be a PMOS transistor. The logic circuit output voltage can be applied to the third transistor gate terminal. The target voltage can be applied to the third transistor source terminal. The third transistor drain terminal can be connected to the inverter circuit output. The fourth transistor includes a fourth transistor gate terminal, a fourth transistor source terminal, and a fourth transistor drain terminal. The fourth transistor can be an NMOS transistor. The logic circuit output voltage can be applied to the fourth transistor gate terminal. A ground voltage can be applied to the fourth transistor drain terminal. The fourth transistor source terminal can be connected to the inverter circuit output.

The voltage level comparator can include a buffer. The buffer can be located downstream of the inverter.

In another aspect, a method of generating a regulated output voltage includes generating a digital control signal that alternates between a first voltage level and a second voltage level in response to changes in relative voltage level between the regulated output voltage and a target voltage for the regulated output voltage. Switching of a power transistor is controlled with the digital control signal. The digital control signal causes the power transistor to switch from off to on in response to a reduction of the regulated output voltage relative to the target voltage. The digital control signal causes the power transistor to switch from on to off in response to an increase of the regulated output voltage relative to the target voltage. Variation in the regulated output voltage is decreased, via a charge accumulator, relative to variation in the output voltage that would occur without the charge accumulator. In many embodiments of the method, the charge accumulator includes a capacitor.

In many embodiments of the method, the digital control signal is based on the regulated output voltage and the target voltage. For example, the digital control signal can cause the power transistor to switch from off to on in response to a reduction of the regulated output voltage from greater than the target voltage to less than the target voltage. The digital control signal can cause the power transistor to switch from on to off in response to an increase of the regulated output voltage from less than the target voltage to greater than the target voltage. In some embodiments of the method, generating the digital control signal includes generating a logic circuit output voltage that varies between a logic circuit upper limit output voltage and a logic circuit lower limit output voltage based on a relative difference between the regulated output voltage and the target voltage. The logic circuit output voltage can be equal to a logic circuit intermediate output voltage when the regulated output voltage is equal to the target voltage. The logic circuit intermediate output voltage can be less than the logic circuit upper limit output voltage and greater than the logic circuit lower limit output voltage. The logic circuit output voltage can be greater than the logic circuit intermediate output voltage when the regulated output voltage is less than the target voltage. The logic circuit output voltage can be less than the logic circuit intermediate output voltage when the regulated output voltage is greater than the target voltage. The logic circuit upper limit output voltage can be less than the target voltage. The logic circuit output voltage can be less than the logic circuit intermediate output voltage when the regulated output voltage is greater than the target voltage.

Generating the digital control signal can include generating an inverter circuit output voltage. The inverter circuit output voltage can change from an inverter circuit first output voltage to an inverter circuit second output voltage in response to a decrease in magnitude of the logic circuit output voltage. The inverter circuit output voltage can change from the inverter circuit second output voltage to the inverter circuit first output voltage in response to an increase in magnitude of the logic circuit output voltage. The inverter circuit first output voltage has an inverter circuit first output voltage magnitude. The inverter circuit second output voltage has an inverter circuit second output voltage magnitude. The inverter circuit second output voltage magnitude is greater than the inverter circuit first output voltage magnitude.

For a fuller understanding of the nature and advantages of the present invention, reference should be made to the ensuing detailed description and accompanying drawings.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced in other configurations, or without the specific details. Furthermore, well-known features may be omitted or simplified in order not to obscure the embodiment being described.

Figure 1A:
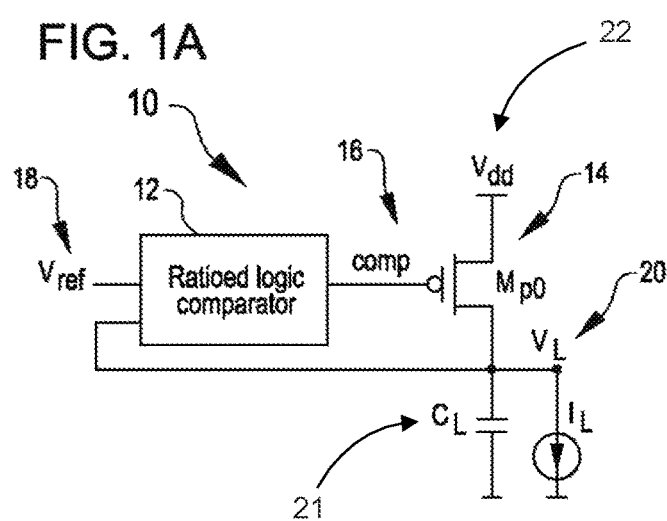
FIG. 1A shows a block diagram of an example of a ratioed logic comparator-based DLDO voltage regulator.

FIG. 1A shows a block diagram of a ratioed logic comparator-based DLDO regulator 10, in accordance with embodiments. The DLDO regulator 10 includes a ratioed logic asynchronous comparator 12, a PMOS power switch 14 and a charge accumulator 21. The DLDO regulator 10 generates a regulated power output having an output voltage (VL 20) and an output current (IL 22) from an input power having an input power voltage (Vdd 22). The comparator 12 receives a target reference voltage (Vref 18) and generates a digital bit comp 16 based on a comparison between the target Vref 18 and the output VL 20. The digital bit comp 16 is connected to the PMOS power switch 14 (at Mp0). The on/off state of the PMOS power switch 14 is controlled by the voltage level of the digital bit comp 16.

Figure 1B:
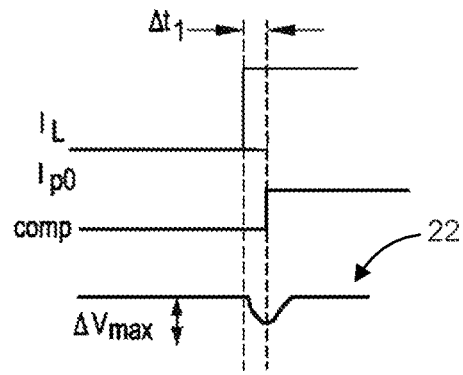
FIG. 1B illustrates a switching time delay and resulting dip in output voltage in response to an instantaneous increase in the output current for the voltage regulator of FIG. 1A.

In many embodiments, the comparator 12 is configured to control the voltage level of the digital bit comp 16 so as to control switching of the PMOS power switch 14 with a small delay so as to limit drift of the output VL 20 from the target Vref 18. The speed of the DLDO regulator 10 is determined by the speed of the ratioed logic comparator 12. For example, as illustrated in FIG. 1B, in response to an instantaneous increase in the output current (IL 22) drawn by the serviced downstream electrical load, the time delay for the comparator 12 to change the voltage level of the digital bit comp 16 from low to high (which changes the PMOS power switch 14 from off to on) is Δt1. During the time delay, the output VL 20 drops due to the PMOS power switch 14 being in the off state due to discharging of the charge accumulator 21. The maximum voltage drop during the time delay (Δt1) is ΔVmax.

In some existing DLDO regulators having a conventional shift register, the time delay for switching the associated number of PMOS transistors by the conventional shift register may be greater as compared to the time delay (Δt1) of the ratioed logic comparator 12. The increased time delay in such existing DLDO regulators results in greater maximum voltage drop as shown in equation (1.1) (below) in which ΔV2 is an additional voltage drop due to delay associated with the conventional shift register and ΔV3 is an additional voltage drop to delay associated with switching the associated PMOS transistors. In contrast, for the ratioed logic comparator-based DLDO regulator 10, the additional voltage drops ΔV2 and ΔV3 are avoided and the ΔVmax is reduced to ΔV1. This leads to a faster response and lower undershoot/overshoot of a ripple of the output voltage.

$$\Delta V_{max} = \Delta V1 + \Delta V2 + \Delta V3 \tag{1.1}$$

Figure 2A:
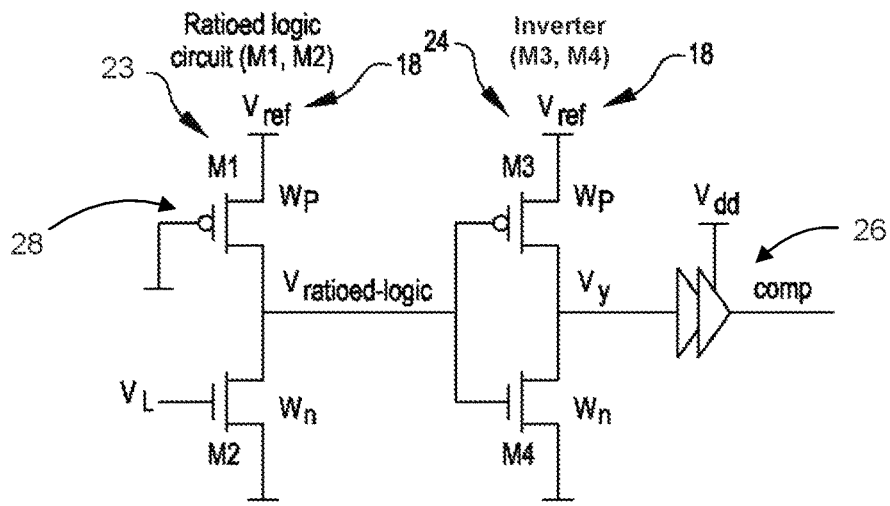
FIG. 2A shows an example of the ratioed logic comparator of FIG. 1A.

FIG. 2A shows an embodiment of the ratioed logic comparator 12. The illustrated embodiment of the ratioed logic comparator 12 includes a ratioed logic circuit 23 and an inverter 24, which are both supplied by the target Vref 18. The ratioed logic circuit 23 includes a PMOS transistor (M1) and a NMOS transistor (M2). The gate terminal 28 of the PMOS transistor (M1) is connected to ground voltage. The gate terminal of the NMOS transistor (M2) is connected to the output VL 20 of the DLDO regulator 10. The function of the inverter 24 is to respond to changes in the output VL 20 and enable the PMOS transistor (M1) to turn off or on. Initially, when the output VL=0, the NMOS transistor (M2) is off and the PMOS transistor (M1) is in a linear region so that Vratioed_logic is pulled up. When the output VL 20 starts increasing and becomes above the Vref 18, the source-drain resistance (Rsds2) of the NMOS transistor (M2) decreases, which decreases Vratioed_logic. The low output voltage level of Vratioed_logic is given in equation (1.2) and it strongly depends on the output VL 20, the target Vref 18, and the aspect ratios of the PMOS transistor (M1) and the NMOS transistor (M2). Conversely, when the output VL 20 drops below the target Vref 18, Rds2 increases and hence the PMOS transistor (M1) pulls up Vratioed_logic. The high output voltage level of Vratioed_logic_high is given in equation (1.3) and it also depends on the output VL 20, the target Vref 18, and βp/βn where β depends on the geometry of the transistor $$\frac{W}{L}$$

and the characteristics of the channel $\mu C_{ox}$ ($\mu$ is the charge mobility and $C_{ox}$ is the oxide capacitor) and given as $$\beta_p = \mu_p C_{ox} \frac{W_p}{L_p} \text{ and } \beta_n = \mu_n C_{ox} \frac{W_n}{L_n}$$

where $V_{Tn}$ and $V_{Tp}$ are the NMOS and PMOS threshold voltages, respectively.

$$V_{ratioed-logic-low} = (V_L - V_{Tn}) - \sqrt{(V_L - V_{Tn})^2 - \frac{\beta_p}{\beta_n}(V_{ref} - V_{Tp})^2} \tag{1.2}$$

$$V_{ratioed-logic-high} = V_{Tp} + \sqrt{(V_{ref} - V_{Tp})^2 - \frac{\beta_n}{\beta_p}(V_L - V_{Tn})^2} \tag{1.3}$$

Figure 2B:
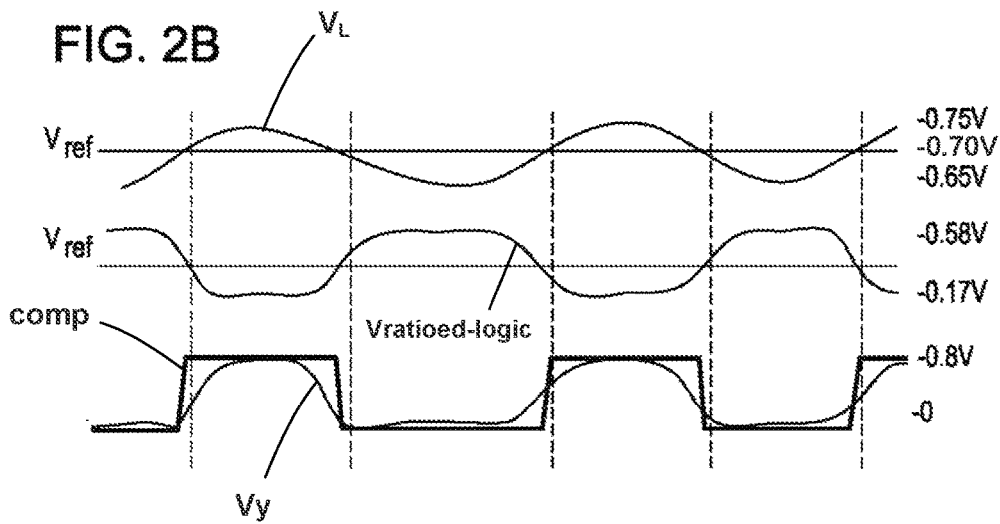
FIG. 2B shows example waveforms for the ratioed logic comparator of FIG. 1A.

To better illustrate the operation of the ratioed logic comparator 12, FIG. 2B shows example resulting waveforms where the target Vref 18=0.7 Volts and the output VL 20 varies between 0.75 and 0.65 V. When the output VL 20 increases above 0.7 Volts, for example, to 0.75 Volts, Vratioed_logic decrease to 0.17 Volts. In the other direction, when the output VL 20 decreases below 0.7 Volts, for example, to 0.65 Volts, Vratioed_logic increases up to 0.58 Volts. Note that Vratioed_logic does not reach the Vref 18 or the ground voltage but rather stay in a high gain region of the Vratioed_logic. The Vratioed_logic is input to the inverter 24, which outputs voltage Vy. The inverter 24 pulls up the voltage Vy to the target Vref 18 or pulls down the voltage Vy to ground voltage. A buffer 26 is added in order to generate an output comp signal from an input Vy in order to control the PMOS switch (M1).

Figure 3A:
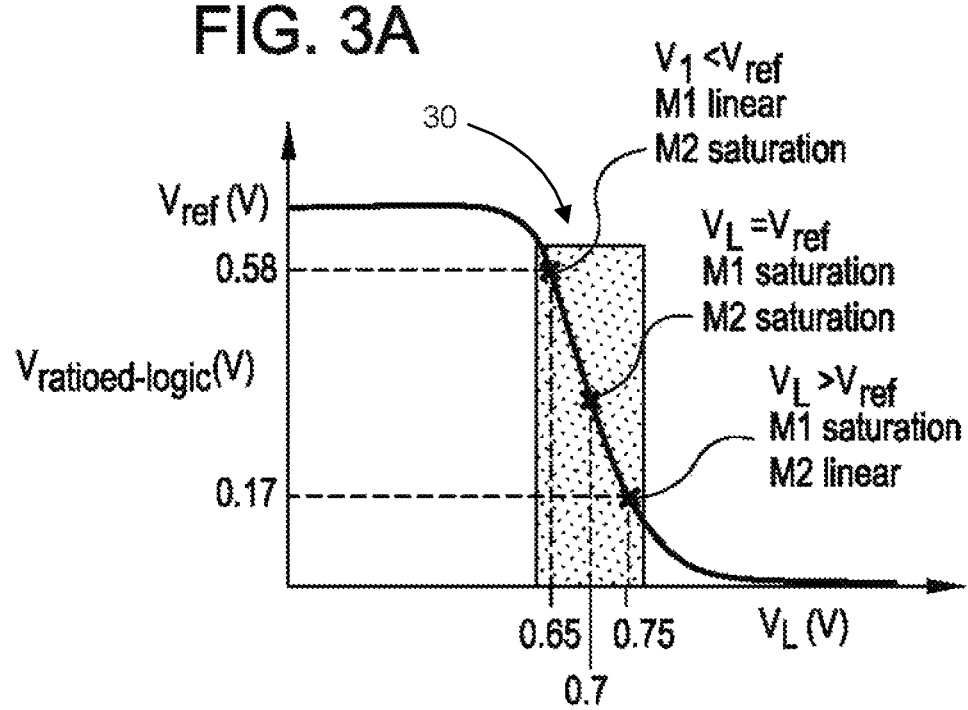
FIG. 3A shows transfer characteristics of the ratioed logic circuit of FIG. 2A.
Figure 3B:
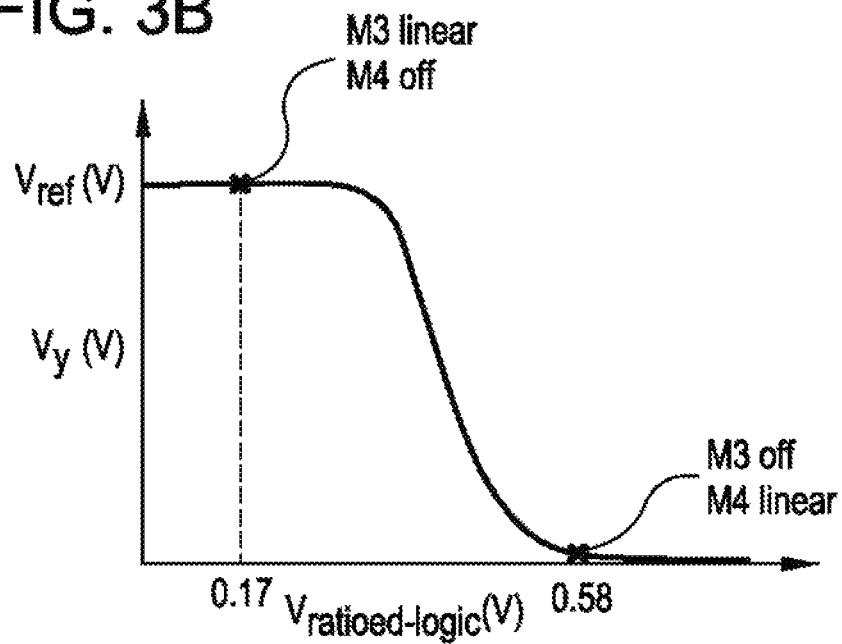
FIG. 3B shows transfer characteristics of the inverter of FIG. 2A.

FIG. 3A shows the transfer characteristics of the ratioed logic circuit 23. FIG. 3B shows the transfer characteristics of the inverter 24. As shown in FIG. 3A, the ratioed-logic circuit 23 operates in the highlighted region 30. In order to achieve such operation, the PMOS transistor (M1) and the NMOS transistor (M2) are configured accordingly. FIG. 3B shows that when the output VL 20>Vref 18, transistor (M3) is in linear region whereas transistor (M4) is off so that voltage Vy=Vref 18. In addition, when the output VL 20<Vref 18, transistor (M3) is off whereas transistor (M4) is in linear region, which produces voltage Vy=0. In many embodiments, M3 and M4 are nominal threshold voltage MOS devices.

Figure 4A:
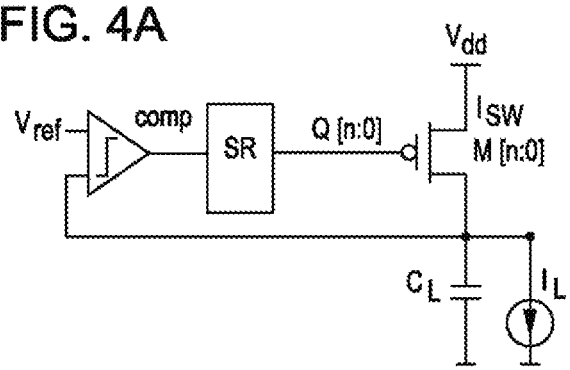
FIGS. 4A, 4B, 4C, and 4D show architecture of synchronous shift register (SR)-based control DLDO designs.
Figure 5:
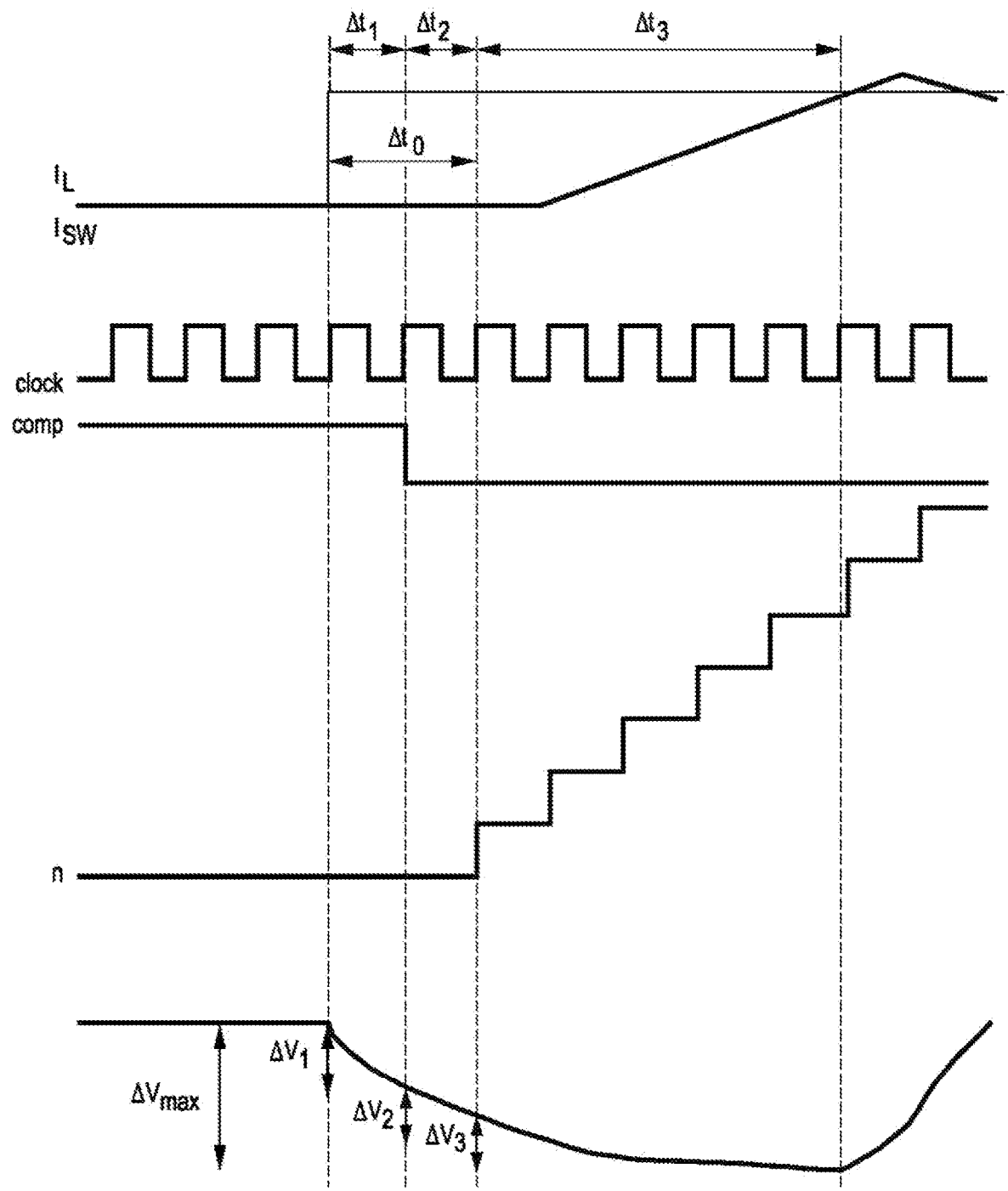
FIG. 5 shows a set of signal curves illustrating how, when PMOS power switches are sequentially turned on in a system utilizing a synchronous shift register (SR)-based control DLDO design, the current supply of a switch Isw starts increasing.

Existing DLDO regulator designs are discussed in the literature based on the way that the power switch is controlled. For example, FIG. 4A shows the architecture of a synchronous shift register (SR)-based control DLDO design. As shown in FIG. 4A, the SR-based DLDO consists of a clocked comparator, an n-bit SR and an n-power switch. The number of active power switches n depends on the required load current IL. If the load voltage VL is lower than the reference voltage Vref, the output of the comparator will be logic low and the synchronous SR will shift n-bit towards the right in order to increase the number of activated power switches. In contrast, if VL is higher than Vref, the output of the comparator will become logic high and the synchronous SR will shift the n-bit towards the left to decrease the number of active power switches. The synchronous SR can therefore shift one bit per clock cycle that consequently activates or deactivates one power switch per clock cycle. This mechanism affects the SR-based DLDO speed and response time during a transient loading event as shown in FIG. 5, where two time delays are introduced. The first time delay $\Delta t1$ is the time that the comparator takes to react when IL steps up with a very short transition. The second time delay $\Delta t2$ is the time that the synchronous SR takes to react to turn on the power switch. Hence, the synchronous DLDO requires a total of two clock cycles $\Delta to$ to respond to the load transient if the load current steps up immediately after the clock rising edge. This time delay causes a voltage droop at the output. The maximum voltage droop $\Delta Vmax$ is determined in equation (1.1) (above) where $\Delta V1$ is the voltage droop during $\Delta t1$, $\Delta V2$ is the voltage droop during $\Delta t2$ and, $\Delta V3$ is the voltage droop during the time $\Delta t3$ that SR takes to turn on the target number of the switches. As shown in FIG. 5, once the PMOS power switches are turned on, the current supply of the switch Isw starts increasing. One way to minimize the undershoot/overshoot and to enhance the DLDO speed is to increase the clock frequency, however, the quiescent current increases. Therefore, the demand to improve the transient speed response and current efficiency, simultaneously, is increasing.

Figure 4B:
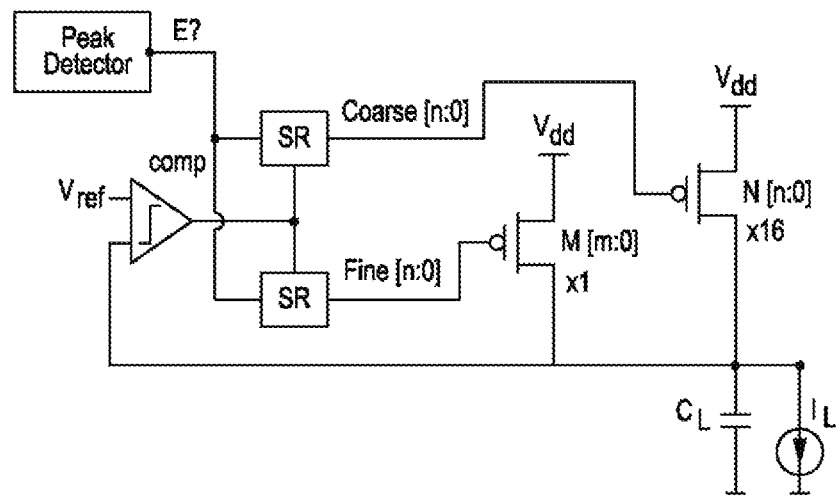
Figure 4C:
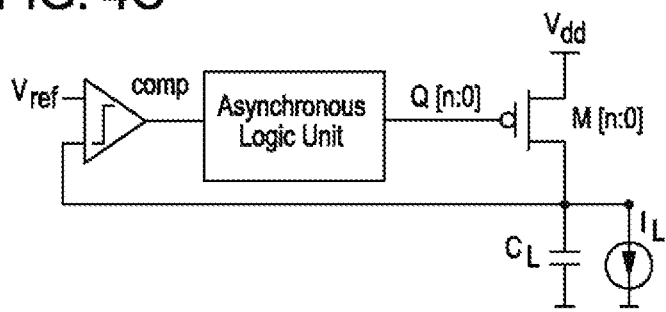

To solve the speed-power tradeoff, a coarse-fine tuning (CFT) technique can be used during the transient load. FIG. 4B shows a CFT-DLDO design that includes two main loops: coarse and fine. The coarse loop is enabled during the transient load to activate or deactivate transistor having a relatively large power (e.g., width x16) and using a higher clock frequency of 500 MHz. Subsequently, a fine loop can be enabled with smaller transistors' width x1 and lower clock frequency of 50 MHz during the steady state condition. The CFT technique enhances the transient speed and decreases $\Delta V3$ by more rapidly changing the power level during the transient load. However, $\Delta V1$ and $\Delta V2$ still exist due to the clocked comparator and synchronous SR. Therefore, minimizing $\Delta V1$ and $\Delta V2$ by minimizing $\Delta t1$ and $\Delta t2$, respectively, is favored. To reduce $\Delta t1$, the use of a clocked comparator can be eliminated with the introduction of a logic-threshold triggered comparator that triggers the difference between the reference voltage and output voltage. To reduce $\Delta t2$, the synchronous SR is replaced by asynchronous control unit as shown in FIG. 4C. However, asynchronous logic circuits are more sensitive to PVT variations as the delay increases significantly at subthreshold supply voltage. The asynchronous DLDO can accommodate a low supply voltage operating point including the CFT technique. The asynchronous logic units are used in coarse loop and the barrel SR is used in the fine loop. Although this work reduces $\Delta V2$ (by using asynchronous logic unit) and $\Delta V3$ (by using CFT technique), $\Delta V1$ still exists due to the usage of the clocked comparator.

Alternatively, ADCs can be utilized to implement a multi-bit quantization technique so that multiple power switches can be activated or deactivated during each clock cycle. For example, a 7-bit inverter-based ADC and event driven control technique can be used rather than a time driven technique to minimize the load transient time response. However, as previously applied, this technique requires the use of 7 voltage reference levels. As an alternative, a flash ADC can be used that removes the delay control loop of the DLDO. In this case, the speed of the DLDO is determined by the speed of the ash ADC. However, the speed-power trade-off still exists because the design suffers from large quiescent current.

Voltage-to-time converters (VTC) can be used by converting Vref and Vout into pulses, where each pulse duty corresponds to the voltage amplitude. In such cases, the phase detector can measure a time difference between Vref and Vout that corresponds to a voltage difference between Vref and Vout. This time difference is digitized through a time-to-digital converter (TDaC) and then stored into an UP/DN counter that activates or deactivates the required number of power switches.

Figure 4D:
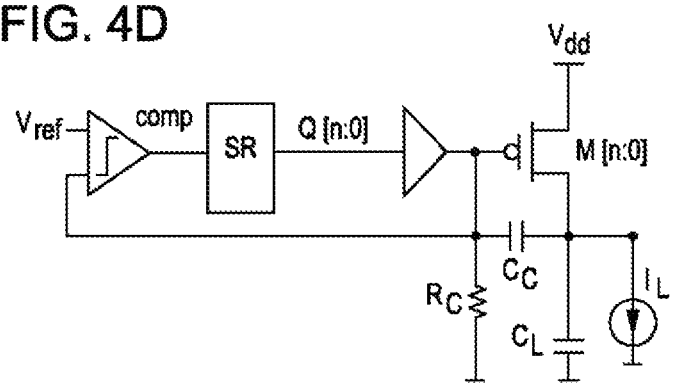

A hybrid LDO regulator can be implemented where both analog and digital control techniques are utilized. For example, an additional high pass analog loop in parallel with a digital loop can achieve faster response as shown in FIG. 4D. The advantage of this design is that the analog loop responds immediately to the load transient before the digital loop, and the PMOS power switch can be replaced with an NMOS that provides higher current during the load transient when the load voltage drops. However, this approach requires a charge pump that adds extra power budget to overdrive the NMOS transistor. Thus, as discussed above, all existing approaches suffer from deficiencies in response speed, power requirement, or require additional hardware that adds a layer of complexity.

Various computational methods discussed above may be performed in conjunction with or using a computer or other processor having hardware, software, and/or firmware. The various method steps may be performed by modules, and the modules may comprise any of a wide variety of digital and/or analog data processing hardware and/or software arranged to perform the method steps described herein. The modules optionally comprising data processing hardware adapted to perform one or more of these steps by having appropriate machine programming code associated therewith, the modules for two or more steps (or portions of two or more steps) being integrated into a single processor board or separated into different processor boards in any of a wide variety of integrated and/or distributed processing architectures. These methods and systems will often employ a tangible media embodying machine-readable code with instructions for performing the method steps described above. Suitable tangible media may comprise a memory (including a volatile memory and/or a non-volatile memory), a storage media (such as a magnetic recording on a floppy disk, a hard disk, a tape, or the like; on an optical memory such as a CD, a CD-R/W, a CD-ROM, a DVD, or the like; or any other digital or analog storage media), or the like.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice.

The following definitions and explanations are meant and intended to be controlling in any future construction unless clearly and unambiguously modified in the following examples or when application of the meaning renders any construction meaningless or essentially meaningless. In cases where the construction of the term would render it meaningless or essentially meaningless, the definition should be taken from Webster's Dictionary, 3rd Edition or a dictionary known to those of skill in the art, such as the Oxford Dictionary of Biochemistry and Molecular Biology (Ed. Anthony Smith, Oxford University Press, Oxford, 2004).

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "above," and "below" and words of similar import, when used in this application, shall refer to this application as a whole and not to any particular portions of the application.

The description of embodiments of the disclosure is not intended to be exhaustive or to limit the disclosure to the precise form disclosed. While the specific embodiments of, and examples for, the disclosure are described herein for illustrative purposes, various equivalent modifications are possible within the scope of the disclosure, as those skilled in the relevant art will recognize.

All references, including patent filings (including patents, patent applications, and patent publications), scientific journals, books, treatises, technical references, and other publications and materials discussed in this application, are incorporated herein by reference in their entirety for all purposes.

Aspects of the disclosure can be modified, if necessary, to employ the systems, functions, and concepts of the above references and application to provide yet further embodiments of the disclosure. These and other changes can be made to the disclosure in light of the detailed description.

Specific elements of any foregoing embodiments can be combined or substituted for elements in other embodiments. Furthermore, while advantages associated with certain embodiments of the disclosure have been described in the context of these embodiments, other embodiments may also exhibit such advantages, and not all embodiments need necessarily exhibit such advantages to fall within the scope of the disclosure.

While the above provides a full and complete disclosure of exemplary embodiments of the present invention, various modifications, alternate constructions and equivalents may be employed as desired. Consequently, although the embodiments have been described in some detail, by way of example and for clarity of understanding, a variety of modifications, changes, and adaptations will be obvious to those of skill in the art. Accordingly, the above description and illustrations should not be construed as limiting the invention, which can be defined by the appended claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A digital logic voltage regulator for generating a regulated output voltage, the digital logic voltage regulator comprising:
    a voltage level comparator comprising a first input and a second input, wherein a target voltage is applied to the first input, wherein the regulated output voltage is applied to the second input, wherein the voltage level comparator generates a digital control signal that alternates between a first voltage level and a second voltage level in response to changes in relative voltage level between the regulated output voltage and the target voltage;
    a power transistor comprising a power transistor gate terminal, a power transistor source terminal, and a power transistor drain terminal; wherein the digital control signal is applied to the power transistor gate terminal, wherein the power transistor source terminal is connected to a power source, and wherein the power transistor drain terminal is connected to an electrical load to supply electrical power having the regulated output voltage, wherein the digital control signal causes the power transistor to switch from off to on in response to a reduction of the regulated output voltage relative to the target voltage, and wherein the digital control signal causes the power transistor to switch from on to off in response to an increase of the regulated output voltage relative to the target voltage; and
    a charge accumulator connected to the power transistor drain terminal so as to decrease variation in the regulated output voltage that would occur without the charge accumulator,
    wherein:
        the voltage level comparator comprises a logic circuit comprising the first input, the second input, and a logic circuit output;
        the logic circuit generates a logic circuit output voltage that is output via the logic circuit output, wherein the logic circuit output voltage varies between a logic circuit upper limit output voltage and a logic circuit lower limit output voltage based on a relative difference between the regulated output voltage and the target voltage;
        the logic circuit output voltage is equal to a logic circuit intermediate output voltage when the regulated output voltage is equal to the target voltage;
        the logic circuit intermediate output voltage is less than the logic circuit upper limit output voltage and greater than the logic circuit lower limit output voltage;
        the logic circuit output voltage is greater than the logic circuit intermediate output voltage when the regulated output voltage is less than the target voltage; and
        the logic circuit output voltage is less than the logic circuit intermediate output voltage when the regulated output voltage is greater than the target voltage.

2. The digital logic voltage regulator of claim 1, wherein the charge accumulator comprises a capacitor connected between the power transistor drain terminal and a ground voltage.

3. The digital logic voltage regulator of claim 1, wherein:
    the digital control signal causes the power transistor to switch from off to on in response to a reduction of the regulated output voltage from greater than the target voltage to less than the target voltage; and
    the digital control signal causes the power transistor to switch from on to off in response to an increase of the regulated output voltage from less than the target voltage to greater than the target voltage.

4. The digital logic voltage regulator of claim 1, wherein:
    the logic circuit upper limit output voltage is less than the target voltage; and
    the logic circuit output voltage is less than the logic circuit intermediate output voltage when the regulated output voltage is greater than the target voltage.

5. The digital logic voltage regulator of claim 1, wherein the digital control signal causes the power transistor to switch from on to off in response to an increase of the regulated output voltage from less than the target voltage to greater than the target voltage.

6. A digital logic voltage regulator for generating a regulated output voltage, the digital logic voltage regulator comprising:
    a voltage level comparator comprising a first input and a second input, wherein a target voltage is applied to the first input, wherein the regulated output voltage is applied to the second input, wherein the voltage level comparator generates a digital control signal that alternates between a first voltage level and a second voltage level in response to changes in relative voltage level between the regulated output voltage and the target voltage;
    a power transistor comprising a power transistor gate terminal, a power transistor source terminal, and a power transistor drain terminal; wherein the digital control signal is applied to the power transistor gate terminal, wherein the power transistor source terminal is connected to a power source, and wherein the power transistor drain terminal is connected to an electrical load to supply electrical power having the regulated output voltage, wherein the digital control signal causes the power transistor to switch from off to on in response to a reduction of the regulated output voltage relative to the target voltage, and wherein the digital control signal causes the power transistor to switch from on to off in response to an increase of the regulated output voltage relative to the target voltage; and
    a charge accumulator connected to the power transistor drain terminal so as to decrease variation in the regulated output voltage that would occur without the charge accumulator;

wherein the voltage level comparator comprises a logic circuit comprising the first input, the second input, and a logic circuit output;

wherein the logic circuit generates a logic circuit output voltage that is output via the logic circuit output, wherein the logic circuit output voltage varies between a logic circuit upper limit output voltage and a logic circuit lower limit output voltage based on a relative difference between the regulated output voltage and the target voltage; and wherein the logic circuit comprises:
- a first transistor comprising a first transistor gate terminal, a first transistor source terminal, and a first transistor drain terminal; wherein the first transistor is a PMOS transistor; wherein a ground voltage is applied to the first transistor gate terminal, wherein the target voltage is applied to the first transistor source terminal, and wherein the first transistor drain terminal is connected to the logic circuit output; and
- a second transistor comprising a second transistor gate terminal, a second transistor source terminal, and a second transistor drain terminal; wherein the second transistor is a N-type metal-oxide-semiconductor logic (NMOS) transistor, wherein the regulated output voltage is applied to the second transistor gate terminal, wherein the ground voltage is applied to the second transistor drain terminal, and wherein the second transistor source terminal is connected to the logic circuit output.

7. A digital logic voltage regulator for generating a regulated output voltage, the digital logic voltage regulator comprising:
- a voltage level comparator comprising a first input and a second input, wherein a target voltage is applied to the first input, wherein the regulated output voltage is applied to the second input, wherein the voltage level comparator generates a digital control signal that alternates between a first voltage level and a second voltage level in response to changes in relative voltage level between the regulated output voltage and the target voltage;
- a power transistor comprising a power transistor gate terminal, a power transistor source terminal, and a power transistor drain terminal; wherein the digital control signal is applied to the power transistor gate terminal, wherein the power transistor source terminal is connected to a power source, and wherein the power transistor drain terminal is connected to an electrical load to supply electrical power having the regulated output voltage, wherein the digital control signal causes the power transistor to switch from off to on in response to a reduction of the regulated output voltage relative to the target voltage, and wherein the digital control signal causes the power transistor to switch from on to off in response to an increase of the regulated output voltage relative to the target voltage; and
- a charge accumulator connected to the power transistor drain terminal so as to decrease variation in the regulated output voltage that would occur without the charge accumulator;

wherein:
- the voltage level comparator comprises a logic circuit comprising the first input, the second input, and a logic circuit output;
- the logic circuit generates a logic circuit output voltage that is output via the logic circuit output, wherein the logic circuit output voltage varies between a logic circuit upper limit output voltage and a logic circuit lower limit output voltage based on a relative difference between the regulated output voltage and the target voltage;
- the voltage level comparator comprises an inverter circuit comprising an inverter circuit input and an inverter circuit output;
- the logic circuit output voltage is applied to the inverter circuit input;
- the inverter circuit generates an inverter circuit output voltage that is output via the inverter circuit output;
- the inverter circuit output voltage changes from an inverter circuit first output voltage to an inverter circuit second output voltage in response to a decrease in magnitude of the logic circuit output voltage;
- the inverter circuit output voltage changes from the inverter circuit second output voltage to the inverter circuit first output voltage in response to an increase in magnitude of the logic circuit output voltage;
- the inverter circuit first output voltage has an inverter circuit first output voltage magnitude;
- the inverter circuit second output voltage has an inverter circuit second output voltage magnitude; and
- the inverter circuit second output voltage magnitude is greater than the inverter circuit first output voltage magnitude.

8. The digital logic voltage regulator of claim 7, wherein the inverter circuit comprises:
- a third transistor comprising a third transistor gate terminal, a third transistor source terminal, and a third transistor drain terminal; wherein the third transistor is a PMOS transistor, wherein the logic circuit output voltage is applied to the third transistor gate terminal, wherein the target voltage is applied to the third transistor source terminal, and wherein the third transistor drain terminal is connected to the inverter circuit output; and
- a fourth transistor comprising a fourth transistor gate terminal, a fourth transistor source terminal, and a fourth transistor drain terminal; wherein the fourth transistor is an NMOS transistor, wherein the logic circuit output voltage is applied to the fourth transistor gate terminal, wherein a ground voltage is applied to the fourth transistor drain terminal, and wherein the fourth transistor source terminal is connected to the inverter circuit output.

9. The digital logic voltage regulator of claim 8, wherein the voltage level comparator comprises a buffer downstream of the inverter circuit.

10. A method of generating a regulated output voltage, the method comprising:
- generating a digital control signal that alternates between a first voltage level and a second voltage level in response to changes in relative voltage level between the regulated output voltage and a target voltage for the regulated output voltage;
- controlling switching of a power transistor with the digital control signal, wherein the digital control signal causes the power transistor to switch from off to on in response to a reduction of the regulated output voltage relative to the target voltage, and wherein the digital control signal causes the power transistor to switch from on to off in response to an increase of the regulated output voltage relative to the target voltage; and decreasing variation in the regulated output voltage, via a charge accumulator, relative to variation in the regulated output voltage that would occur without the charge accumulator;

wherein:

generating the digital control signal comprises generating a logic circuit output voltage that varies between a logic circuit upper limit output voltage and a logic circuit lower limit output voltage based on a relative difference between the regulated output voltage and the target voltage;

the logic circuit output voltage is equal to a logic circuit intermediate output voltage when the regulated output voltage is equal to the target voltage;

the logic circuit intermediate output voltage is less than the logic circuit upper limit output voltage and greater than the logic circuit lower limit output voltage;

the logic circuit output voltage is greater than the logic circuit intermediate output voltage when the regulated output voltage is less than the target voltage; and the logic circuit output voltage is less than the logic circuit intermediate output voltage when the regulated output voltage is greater than the target voltage.

11. The method of claim 10, wherein:

the digital control signal causes the power transistor to switch from off to on in response to a reduction of the regulated output voltage from greater than the target voltage to less than the target voltage; and the digital control signal causes the power transistor to switch from on to off in response to an increase of the regulated output voltage from less than the target voltage to greater than the target voltage.

12. The method of claim 10, wherein the digital control signal causes the power transistor to switch from on to off in response to an increase of the regulated output voltage from less than the target voltage to greater than the target voltage.

13. The method of claim 10, wherein the charge accumulator comprises a capacitor.

14. The method of claim 10, wherein:

the logic circuit upper limit output voltage is less than the target voltage; and the logic circuit output voltage is less than the logic circuit intermediate output voltage when the regulated output voltage is greater than the target voltage.

15. A method of generating a regulated output voltage, the method comprising:

generating a digital control signal that alternates between a first voltage level and a second voltage level in response to changes in relative voltage level between the regulated output voltage and a target voltage for the regulated output voltage;

controlling switching of a power transistor with the digital control signal, wherein the digital control signal causes the power transistor to switch from off to on in response to a reduction of the regulated output voltage relative to the target voltage, and wherein the digital control signal causes the power transistor to switch from on to off in response to an increase of the regulated output voltage relative to the target voltage; and decreasing variation in the regulated output voltage, via a charge accumulator, relative to variation in the regulated output voltage that would occur without the charge accumulator;

wherein generating the digital control signal comprises:

generating a logic circuit output voltage that varies between a logic circuit upper limit output voltage and a logic circuit lower limit output voltage based on a relative difference between the regulated output voltage and the target voltage; and generating an inverter circuit output voltage, wherein the inverter circuit output voltage changes from an inverter circuit first output voltage to an inverter circuit second output voltage in response to a decrease in magnitude of the logic circuit output voltage, wherein the inverter circuit output voltage changes from the inverter circuit second output voltage to the inverter circuit first output voltage in response to an increase in magnitude of the logic circuit output voltage, wherein the inverter circuit first output voltage has an inverter circuit first output voltage magnitude, wherein the inverter circuit second output voltage has an inverter circuit second output voltage magnitude, and wherein the inverter circuit second output voltage magnitude is greater than the inverter circuit first output voltage magnitude.

* * * * *